(12) United States Patent
Steinmeier et al.

(10) Patent No.: US 7,130,726 B2
(45) Date of Patent: *Oct. 31, 2006

(54) METHOD AND DEVICE FOR VISUALIZING AN AUTOMOTIVE REPAIR CYCLE

(75) Inventors: Eckhard Steinmeier, Munich (DE); Ralf Rachholz, Munich (DE); Birsen Goek, Munich (DE); Martin Kulessa, Munich (DE); Bernhard Hoess, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/202,212

(22) Filed: Aug. 12, 2005

(65) Prior Publication Data

US 2005/0273230 A1    Dec. 8, 2005

Related U.S. Application Data

(63) Continuation of application No. PCT/EP2004/001687, filed on Feb. 20, 2004.

(30) Foreign Application Priority Data

Feb. 24, 2003   (DE) ................. 103 07 980
Feb. 24, 2003   (DE) ................. 103 07 981

(51) Int. Cl.
*G01M 17/00*   (2006.01)
(52) U.S. Cl. .............. 701/29; 701/31; 700/23
(58) Field of Classification Search .......... 701/29, 701/31–34; 700/95–98, 103, 108–110, 28, 700/11, 17, 23; 702/33, 35–36, 150–153; 705/1, 29

See application file for complete search history.

(56) References Cited

U.S. PATENT DOCUMENTS 5,737,739 A    4/1998   Shirley et al.
5,774,361 A *  6/1998   Colarelli et al. ............ 701/29

(Continued)

FOREIGN PATENT DOCUMENTS

DE    199 53 739 A1    7/2001

(Continued)

OTHER PUBLICATIONS

Lattice3D: "Manuals with Complete 3D Visualization—Faster, Better, More Accurate." Internet, 'Online !, Mar. 11, 2003, XP002285845; URL: www.lattice3d.com/L3D_DS-05_Manual_110303a.pdf> 'genfunden am 204-06-24!.
R.S. Blue et al., "An automated approach and virtual environment for generating maintenance instructions" Conference On Human Factors In Computing Systems—Demonstration Session, Apr. 20, 2002, XP 002285847, Minneapolis, Minnesota, USA ISBN: 1-58113-454-1.

(Continued)

*Primary Examiner*—Gertrude A. Jeanglaude
(74) *Attorney, Agent, or Firm*—Crowell & Moring LLP

(57) ABSTRACT

The invention relates to a method for providing image data for visualizing a defective component and/or a repair cycle and/or a maintenance cycle of a road-bound motor vehicle, especially a passenger case or a motorbike. In order to reduce translation costs occurring for conventional repair instructions, the following steps are provided: digitalized data from at least two components of the vehicle is provided, especially CAD or vector data or another visual data format, digitalized data from the arrangement of the two components of the vehicle relative to each other is also provided. A first selection element for selecting a first repair cycle from a plurality of repair cycles, data or image data of the first step of the first repair cycle is provided, in addition to subsequent data or image data of the second step of the first repair cycle.

24 Claims, 2 Drawing Sheets

U.S. PATENT DOCUMENTS

| | | | |
|---|---|---|---|
| 5,777,597 A * | 7/1998 | Tani et al. | 715/845 |
| 5,867,273 A * | 2/1999 | Corby, Jr. | 356/613 |
| 6,138,056 A | 10/2000 | Hardesty et al. | |
| 6,701,615 B1 * | 3/2004 | Harding et al. | 29/889.1 |
| 6,826,500 B1 * | 11/2004 | Linthicum et al. | 702/98 |
| 2002/0161533 A1 * | 10/2002 | Uegaki | 702/35 |
| 2002/0198639 A1 | 12/2002 | Ellis et al. | |
| 2003/0097195 A1 * | 5/2003 | Yamrom et al. | 700/95 |
| 2004/0148188 A1 * | 7/2004 | Uegaki | 705/1 |

FOREIGN PATENT DOCUMENTS

| | | |
|---|---|---|
| EP | 0 967 456 A2 | 12/1999 |
| EP | 1 065 603 A2 | 1/2001 |
| GB | 2 327 289 A | 1/1999 |
| JP | 2002-2331884 A | 11/2002 |
| WO | WO 00/04372 | 1/1999 |
| WO | WO 00/52537 | 3/2000 |

OTHER PUBLICATIONS

Lattice3D: "Maintenance Manual Item Demo" Internet, Online! XP002285846, URL: www.lattice3d.com/3ddemo/MaintenanceManual/video/MaintenanceManual2.html>.

* cited by examiner

METHOD AND DEVICE FOR VISUALIZING AN AUTOMOTIVE REPAIR CYCLE

CROSS-REFERENCE TO RELATED APPLICATIONS

This application is a continuation of PCT Application No. PCT/EP2004/001687 filed on Feb. 20, 2004, which claims priority to German Application Nos. 103 07 980.7 filed Feb. 24, 2003 and 103 07 981.5 filed Feb. 24, 2003, and which is related to copending application entitled "Method and Device for Visualizing a Vehicle Repairing", U.S. Ser. No. 11/201,112, filed on even date herewith.

The invention relates to a method for providing image data for visualizing a processing operation, particularly on one or more faulty components of a road-bound motor vehicle, such as a passenger car or a motorcycle, and/or a repair sequence of a road-bound motor vehicle, particularly of a passenger car or a motorcycle.

Known repair instructions normally consist of a text and two-dimensional graphics or drawings. The texts of such repair instructions are translated at high expenditure and therefore high cost into the languages of the corresponding countries.

Furthermore, the text-type description of a repair operation is often complicated and its creation requires high expenditures. Such a text is often difficult to understand or, in some cases, may even be misunderstood.

Nowadays, it is particularly problematic to describe and show a complicated construction space because a large number of graphics or photos have to be prepared for this purpose in order to provide complete information to the user concerning the construction space.

One aspect of the invention is to reduce translation costs. It is another aspect to present the instructions for a complicated repair operation in a manner which is processed such that the repair operation is presented to a user in an easily comprehensible manner without misunderstandings. The user is thereby enabled to carry out the repair in an easily understandable manner.

It is another aspect of the invention to provide a method by which the user can obtain complete information, including information also concerning a complicated construction space. Depending on the requirement, the user should be capable of individually requesting the required information, for example, information concerning the position of the components from various perspectives, or have this information displayed.

An aspect of the method according to the invention of providing image data for visualizing a repair sequence of a road-bound motor vehicle, particularly of a passenger car or of a motorcycle, is the following approach. In a first step, the digitized data of one or more components of the vehicle are provided for the visualization, the component or components being displayed particularly as CAD data and/or vector data and/or in another data format which can be visualized. Furthermore, the digitized data of the component, or of the components, are provided in an arrangement corresponding to the arrangement in the vehicle and are visualized. In addition, at least one sequence protocol is provided, in which at least one sequence step of a repair sequence, preferably a plurality of sequence steps of the component arranged in the vehicle (or of the components arranged in the vehicle) is defined. The visualized component (or the visualized components) is moved or changed in the visualization according to the sequence protocol.

Furthermore, a selection overview is provided, in which at least one, and preferably all, sequence steps of a repair operation are provided for the targeted selection and calling of the visualization of the selected sequence step, and a selecting element is provided for the targeted selection and calling of the visualization of one of the sequence steps of the repair operation. After the selection of the sequence step, the image data of the selected sequence step is provided and visualized.

After providing and visualizing the image data of the selected sequence step according to the above description, the selection overview is advantageously provided again.

However, it may also be advantageous, for a subsequent sequence step to be displayed after providing and visualizing the image data of the selection sequence step.

It is, however, particularly advantageous to optionally again provide the selection overview, or display a subsequent sequence step, after providing and visualizing the image data of the selection sequence step according to the above description.

It may, additionally, be advantageous to provide the image data of at least one tool for the actual implementation of a sequence step on the vehicle and to visualize them in the visualization.

In addition to providing a first tool, it is often advantageous to additionally represent the image data of at least a second tool for the actual implementation of another sequence step on the vehicle and to visualize them.

Furthermore, it is often expedient to represent the digitized data of at least one fastening device, which mutually connects two components of the vehicle, and to visualize them.

The digitized data are normally CAD data, vector data, or another data format which can be visualized, the data being reduced in a suitable manner, for example, by compression for reducing the data quantity. These data or the output data, according to the invention, are preferably vehicle construction data, which data exists anyhow and which shows the vehicle in a display in the virtual space. These data preferably are CATIA or Pro-E data familiar to a person skilled in the art. The data may be made available, for example, on a DVD, CD-ROM, or in a databank accessible online.

Since the original construction data can be used for showing the construction space, the construction space is available as a quasi 3-D construction space with a very high information depth. The complete information concerning a construction space can, therefore, be made available to the user. By expediently providing a freely navigable perspective and also, display cutout, depending on the demand, the user can view detailed information from the representation of the construction space. In particular, it is thereby permitted to view complicated repair operations from several perspectives.

The method according to the invention permits a largely visual detailed representation of repair sequences. The display of the virtual repair largely corresponding to the real repair by a mechanic. Translation costs are considerably reduced because of the low (or absent) text portions in the visual representation in comparison to the known solution. As a result of the use of CAD data or CATIA data or the like, which are generated and available anyway from the vehicle construction or in connection with the simulation of production and assembly processes of the vehicle, the method according to the invention can be economically implemented.

It was also found that the understanding of repair sequences is considerably improved by showing the repair sequence according to the method of the invention. Finally, because of the facilitated understanding, the repair by a mechanic is carried out in a shorter time while the repair quality is simultaneously increased in comparison to repairs using conventional repair text instructions.

Other objects, advantages and novel features of the present invention will become apparent from the following detailed description of the invention when considered in conjunction with the accompanying drawings.

DETAILED DESCRIPTION OF THE DRAWINGS

Figure 1:
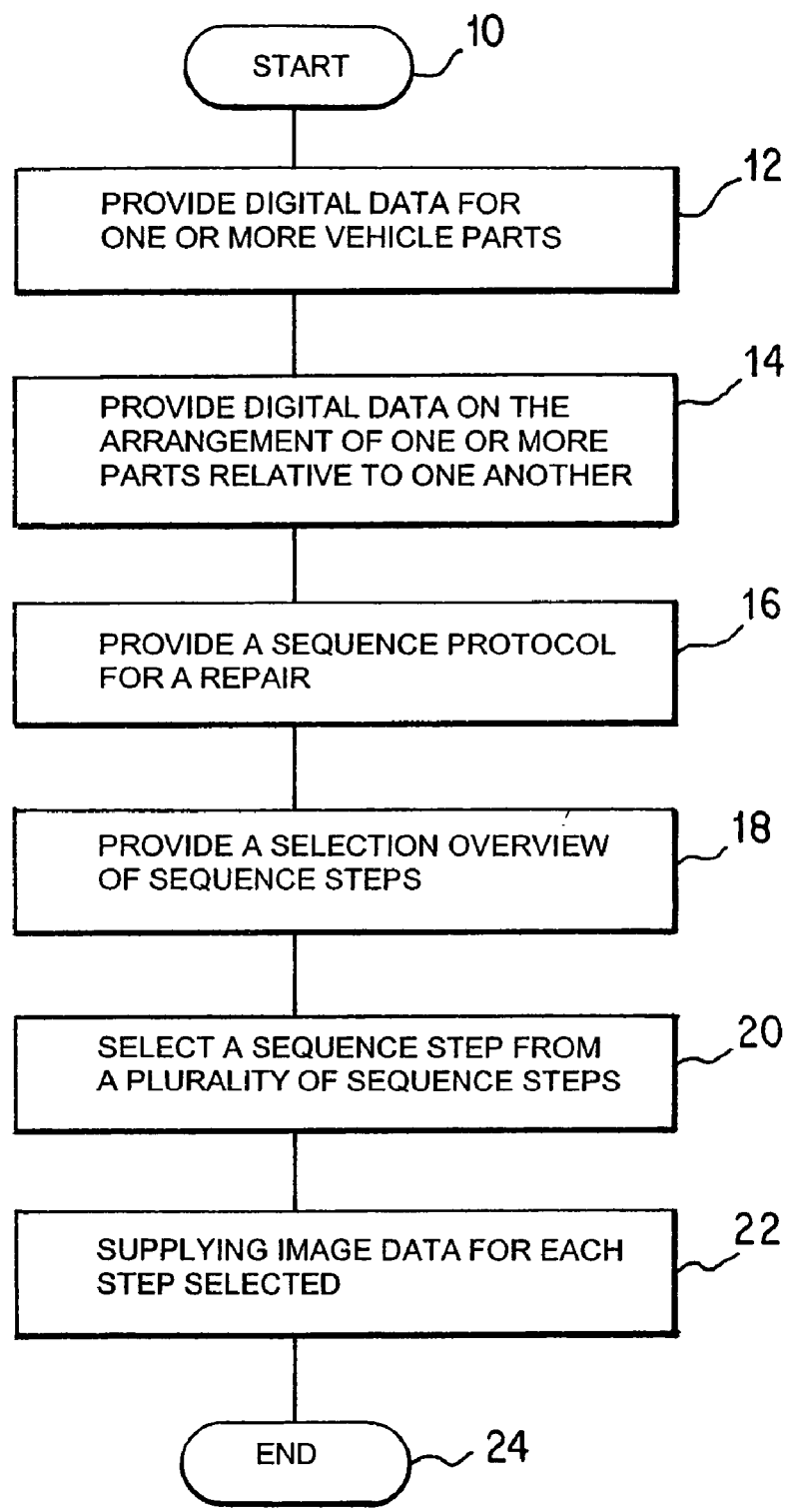
FIG. 1 is a flow chart illustrating a first embodiment of the method according to the present invention.

Referring to FIG. 1, there is shown a flow chart of an embodiment of the method according to the present invention. The method is characterized by the following. After beginning (step 10), digital data is provided and visualized for one or more components of the vehicle (step 12). Next, digital data is provided and visualized for the arrangement of the one or more parts relative to one another (step 14). Then, a sequence protocol for a repair is provided (step 16). Next, a selection overview of sequence steps for the sequence protocol is provided (step 18). Then, the user selects a sequence step (step 20). After selecting the sequence step, image data of the selected sequence step is visualized (step 22).

Figure 2:
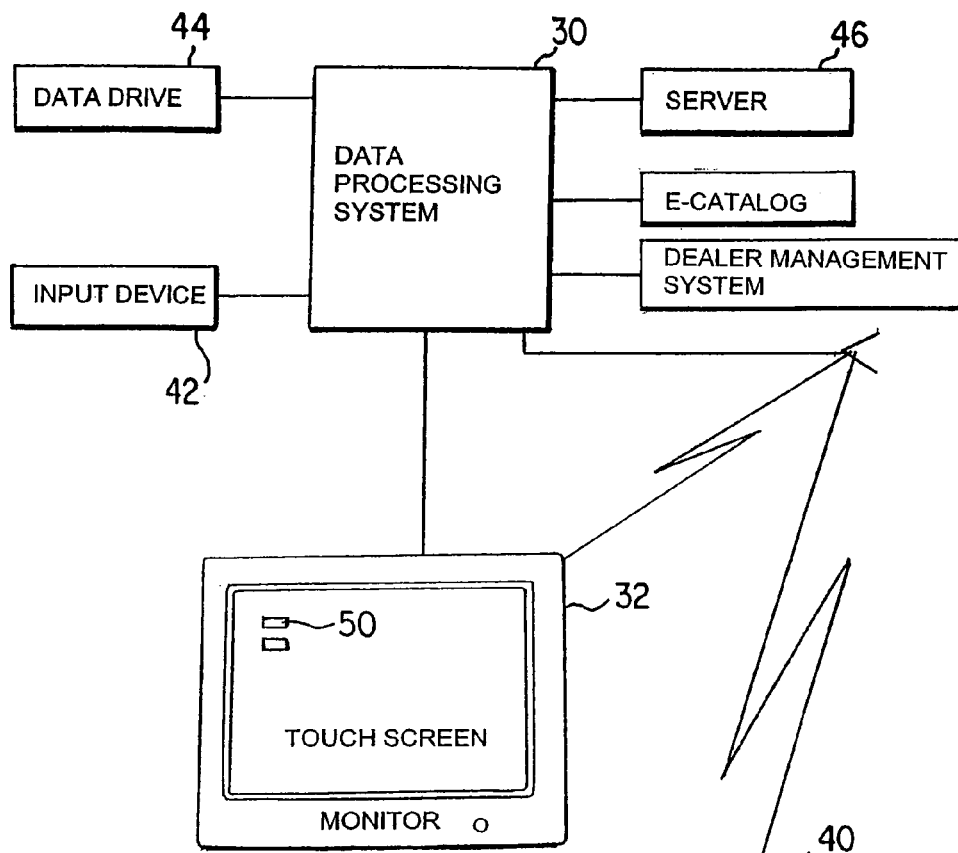
FIG. 2 is a block diagram illustrating the device for performing the method according to the present invention.
Figure 2:
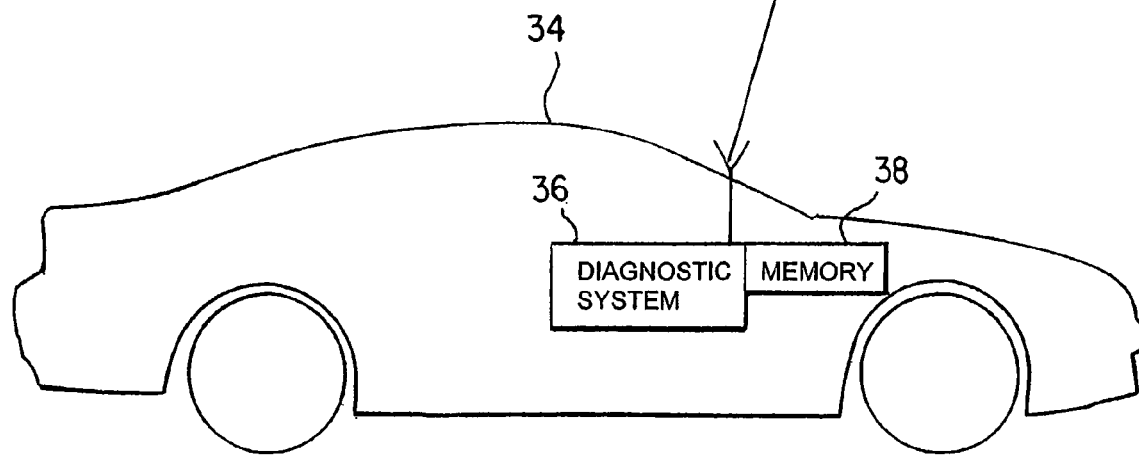

Referring to FIG. 2, in an embodiment of the invention, the use of a data processing system 30 with a manual data input device, particularly a touch-sensitive monitor 30, that is, a so-called touch screen monitor, is provided for representing the provided image data and the first selection element. The first selection element 50 is possibly being selected by manual touch. Such a data processing system or such a repair display device is compact and not susceptible to disturbances even under rough everyday workshop conditions.

The data processing system 30 is equipped with a display 32. The display communicates, preferably in a wireless manner, with the data processing system, or represents a portable combination of a data processing system and a display. In addition to the data processing system, a system according to the invention which is suitable for implementing the above-described method includes a viewing tool, which can be operated on the data processing system and controls a representation of the visualized data in the display. In addition, navigation elements are preferably provided for the preferably free navigation or selection of the viewing angle within the representation of the repair sequences before, during, and/or after the implementation of the respectively shown repair sequence.

In a further development of the invention, the diagnostic system 36 of the vehicle 34 to be repaired or serviced is included in the method according to the invention. The diagnostic system 36 of the vehicle normally has at least one fault memory 38 for detecting the condition or the operational readiness of at least a first electronic component of the vehicle.

According to the invention, the diagnostic system is connected by way of the diagnostic plug of the vehicle and/or in a wireless manner 40 by way of a corresponding transmitting/receiving device with the data processing system. The fault and/or condition data transmitted from the diagnostic system to the data processing system are analyzed in the data processing system. As a function of the concrete fault or condition data, which preferably also show the concrete vehicle type and/or the concrete vehicle equipment, one or more vehicle-type-specific repair sequences are provided for the movie-like representation in the display of the data processing system. For implementing the method, the data processing system according to the invention has a corresponding sequence control, preferably completely or partly controlled by software.

As a further development of the method according to the invention, defective components of the vehicle are shown in a display in a highlighted manner, and visual repair or servicing instructions are provided. This permits a fast implementation of a repair or servicing and, in addition, reduces the fault rate. It is a prerequisite that the function of the component, or the fluid levels of the components to be serviced, is or are monitored by the diagnostic system. The components may, for example, be electrical components, such as control units, relays or switches, as well as electronically monitored components, such as the brake pads. Examples of visually aided servicing work are adding engine or transmission fluids, brake fluid, etc, as well as the exchange of brake pads or other parts subject to wear.

In the case of the method according to the invention, the need to exchange a visually correspondingly indicated component or part is preferably indicated, and (visual) information is supplied with respect to the successfully implemented exchange; for example, in that the electrical function of the exchanged component is detected by the diagnostic device of the vehicle and is transmitted to the data processing system according to the invention and is displayed by the latter. The same applies to a servicing job or a fluid level fill-up of the vehicle in that the data processing system indicates the insufficient fluid level—with the participation of the diagnostic system of the vehicle—and, during the filling-up or after the filling-up, also indicates the current fluid level or a correctly implemented servicing job.

In an embodiment of the method, it is provided that at least the relevant defective component or the part to be serviced, such as a fluid tank or the brake pads, is visibly highlighted in comparison to the other components, in which case, preferably, a detailed representation and/or a representation with a greater resolution and/or an enlarged representation is displayed by the data processing system.

In an alternative or supplementary embodiment of the invention, the data processing system provides a manually operable selection element for changing the viewing angle onto the repair scene. Thus, the mechanic is virtually enabled to look at the repair or servicing sequence from different viewing angles and to eliminate unclear points. This measure according to the invention increases the quality, as well as the speed of the repair or servicing.

In another alternative or supplementary embodiment of the invention, it is provided that the software-controlled data processing system provides a manually operable selection element for the complete or partial masking-out of at least one of the components illustrated in the repair sequence for the display. This measure also aids the clarification of the repair or servicing sequence in the virtual method of representation and leads to a higher quality and speed of the real sequence.

In a particularly preferred embodiment of the invention, the method is implemented by a software-controlled data processing system, which is equipped with a display and a wireless receiving device for receiving the fault and/or condition data of the diagnostic system of the motor vehicle. The wireless uni- or bidirectional communication between the data processing system and the diagnostic system of the vehicle may take place, for example, by way of a connection on the basis of the Bluetooth standard, if the vehicle is equipped correspondingly. Likewise, a so-called wireless LAN connection can be established in that the interface of the diagnostic system to the "outside world" is equipped with a corresponding LAN device or is temporarily equipped therewith in the workshop.

The data processing system is advantageously connected with an electronic replacement part catalogue, so that data can be queried directly concerning components which may be in the store or can be delivered.

It may also be expedient to connect the data processing system with a dealer management system.

For maintaining data of a plurality of individual repair sequences, it is often expedient to connect the data processing system with a content management system, in which a plurality of individual repair sequences are stored and managed.

In another particularly preferred embodiment of the invention, the method according to the invention is implemented by using a touch-sensitive display, i.e., a so-called touch screen. On this touch screen, the type of representation of the repair or servicing sequences, in particular, can be influenced by touching corresponding selection elements in the form of a video animation. This applies particularly with regard to the illustrated viewing angle and/or the complete or partial masking-out of interfering components.

As a rule, the operating sequences are vehicle-specific; that is, they change from one vehicle type to another. It is therefore necessary that the data processing system always has the digitized data of the components, etc. of the corresponding vehicle type available. In order to achieve this, it is provided in an embodiment of the invention that the data processing system determines the vehicle type by using characteristic data which the diagnostic system transmits to the data processing system. The data processing system then prompts the insertion of a specified data carrier, such as a DVD, into a corresponding drive 44 having this data.

As an alternative or in addition, it is provided in another embodiment of the invention that the data processing system retrieves the data from a server 46, which stores the data for a plurality of vehicle types—in an updated form.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for visualizing a repair sequence of a motor vehicle, the method comprising the acts of:
   providing and visualizing digitized data of one or more components of the vehicle, said one or more components being represented in a defined visualizable data format;
   providing and visualizing said digitized data of the one or more components in an arrangement corresponding to an arrangement in the vehicle;
   providing at least one sequence protocol having at least one sequence step of the repair sequence of the motor vehicle, said visualization of the one or more components being moved in the visualization according to the sequence protocol;
   providing a selection overview in which at least one sequence step of the repair sequence is provided for a targeted selection and retrieval of the visualization of the selected sequence step;
   operating a selection element for the targeted selection and retrieval of the visualization of the selected sequence step; and
   providing and visualizing image data of the selected sequence step after operating the selection element to select and retrieve the sequence step.

2. The method according to claim 1, wherein the defined data format is at least one of CAD data and vector data; and
   wherein the at least one sequence protocol provided includes a plurality of sequence steps of the one or more components arranged in the vehicle; and
   further wherein the selection overview provided includes all sequence steps of the repair sequence.

3. The method according to claim 1, further comprising the act of making again available the selection overview after providing and visualizing the image data of the selected sequence step.

4. The method according to claim 1, further comprising the act of representing a subsequent sequence step after providing and visualizing the image data of the selected sequence step.

5. The method according to claim 1, wherein after providing and visualizing the image data of the selected sequence step, the method optionally visualizes again either the selection overview or a subsequent sequence step.

6. The method according to claim 1, further comprising providing and visualizing image data of at least one tool used to actually implement the sequence step on the vehicle.

7. The method according to claim 6, further comprising the act of providing and visualizing, in addition to the first tool, at least a second tool for the actual implementation of another sequence step on the vehicle.

8. The method according to claim 1, further comprising the act of providing and visualizing image data of at least one fastening device, which fastening device mutually connects two components of the vehicle.

9. The method according to claim 6, further comprising the act of providing and visualizing image data of at least one fastening device, which fastening device mutually connects two components of the vehicle.

10. The method according to claim 1, wherein a data processing system having a touch-sensitive monitor display is operated for providing and visualizing the selection element, wherein a first selection is optionally selected by manually touching the selection represented on the display monitor.

11. The method according to claim 10, wherein the vehicle includes a diagnostic system having at least one fault memory for detecting one of a condition and operational readiness of at least one electronic component of the vehicle, the method further comprising the acts of:
   coupling the diagnostic system with the data processing system via at least one of a diagnostic plug connection and a wireless connection;
   providing fault or condition data from the diagnostic system to the data processing system, said data processing system processing the fault or condition data and representing at least a first repair sequence on the display as a function of the processed fault or condition data.

12. The method according to claim 11, wherein the fault or condition data provided by the diagnostic system indicates the vehicle type involved, and further wherein the first repair sequence is represented on the display for the indicated vehicle type.

13. The method according to claim 12, further comprising the acts of:
  representing on the display a removal of a defective electronic component of the vehicle;
  detecting a correct installation of a new electronic component by the diagnostic system;
  transmitting the detected correct installation from the diagnostic system to the data processing system; and
  displaying the correct installation by the data processing system after checking a functioning of the new electronic component by the diagnostic system and transmitting same to the data processing system.

14. The method according to claim 1, further comprising the act of visibly highlighting at least one of the components with respect to at least one other component of the vehicle.

15. The method according to claim 14, wherein the visible highlighting is performed by at least one of providing a more detailed representation, providing greater resolution, and providing an enlarged representation.

16. The method according to claim 10, wherein a manually operable selection element is provided by the data processing system for changing a viewing angle of at least two components illustrated on the display in the repair sequence.

17. The method according to claim 10, wherein the data processing system includes a manually operable selection element for a complete or partial masking-out of at least one of the components represented in the repair sequence.

18. The method according to claim 1, further comprising the act of triggering a representation of additional information outside a display range during, and synchronously with, the representation of the repair sequence.

19. A system for carrying out the method according to claim 1.

20. A system for visualizing a repair sequence of a motor vehicle, the system comprising:
  a data processing system having a display, said display being coupled in a wireless manner with the data processing system;
  a viewing tool operable on the data processing system for controlling a representation of visualized data in the display; and
  navigation elements for allowing a user to freely navigate or select a viewing angle of a particular repair sequence representation before, during and/or after the representation of the repair sequence.

21. The system according to claim 20, wherein the display is a touch screen monitor.

22. The system according to claim 20, further comprising:
  a diagnostic system of the motor vehicle for transmitting fault or condition data of the motor vehicle;
  wherein the data processing system includes a wireless receiving device for receiving the fault or condition data; and
  further wherein the data processing system visualizes on the display at least one repair sequence assigned to the received fault or condition data as well as assigned to the particular motor vehicle; and
  wherein the display is a touch-sensitive display by which a touching of at least one corresponding selection element in the display influences the visualization of the repair sequence with regard to at least one of a viewing angle and a complete or partial masking-out of at least one component.

23. The system according to claim 20, further comprising:
  at least one of an electronic replacement part catalog, a dealer management system, and a content management system in which a plurality of individual repair sequences are stored and managed; and
  wherein the data processing system is couplable with one or more of the electronic replacement part catalog, dealer management system and content management system.

24. A computer product, comprising:
  a computer readable medium having stored thereon program code segments that:
    provide and visualize image data of one or more components of a vehicle;
    provide and visualize image data of an arrangement of said one or more components of the vehicle;
    provide and visualize at least one sequence protocol, including at least one sequence step, for a repair sequence to be performed on the vehicle, wherein the visualized one or more components of the vehicle are moved in the at least one sequence step;
    provide and visualize a selection overview of the sequence steps for the repair sequence;
    provide and visualize a selection element for selecting for a targeted selection of a visualization of one or more of said sequence steps; and
    provide and visualize image data of a selected sequence step after its selection.

* * * * *